United States Patent
Pierrat

[11] Patent Number: 5,962,174
[45] Date of Patent: Oct. 5, 1999

[54] MULTILAYER REFLECTIVE MASK

[75] Inventor: Christophe Pierrat, Boise, Id.

[73] Assignee: Micron Technology, Inc., Boise, Id.

[21] Appl. No.: 09/023,751

[22] Filed: Feb. 13, 1998

[51] Int. Cl.$^6$ .................................................. G03F 9/00
[52] U.S. Cl. .................................................................. 430/5
[58] Field of Search .............................. 430/5, 322, 324

[56] References Cited

U.S. PATENT DOCUMENTS

| 5,328,784 | 7/1994 | Fukuda | 430/5 |
| 5,503,950 | 4/1996 | Miyake et al. | 430/5 |
| 5,514,499 | 5/1996 | Iwamatsu et al. | 430/5 |
| 5,582,939 | 12/1996 | Pierrat | 430/5 |
| 5,686,208 | 11/1997 | Le et al. | 430/5 |
| 5,686,209 | 11/1997 | Iwamatsu et al. | 430/5 |
| 5,795,684 | 8/1998 | Troccolo | 430/5 |

Primary Examiner—S. Rosasco
Attorney, Agent, or Firm—Schwegman, Lundberg Woessner & Kluth P.A.

[57] ABSTRACT

The present invention is a multi layer reflective mask, and a method of fabricating the same, wherein the mask comprises a planar substrate, and a plurality of polished optically reflective regions fabricated on the substrate in an alternating pattern such that the top surface of the reflective regions are substantially co-planar. Each region has a defined phase shift and reflectivity, such that the optical properties of each region are independent of the respective height/thickness of the reflective materials applied to the substrate. Thus, normal planarization procedures performed to the top surface of the reflective regions are sufficient to obtain the optical characteristics of the mask, instead of having to perform a controlled etching process on the substrate to establish specific thicknesses of the reflective materials for defining the desired optical characteristics.

23 Claims, 4 Drawing Sheets

MULTILAYER REFLECTIVE MASK

This invention was made with government support under Contract No. MDA972-92-C-0054, awarded by Advanced Research Projects Agency (ARPA). The Government has certain rights in this invention.

TECHNICAL FIELD OF THE INVENTION

The present invention relates generally to optical lithographic techniques used in the formation of integrated circuits and structures on a semiconductor wafer. In particular, the present invention relates to a mask and a method of fabricating the same.

BACKGROUND OF THE INVENTION

In photolithography, masks are used to expose a pattern upon a semiconductor wafer for the formation of integrated circuits and structures. As manufacturing requirements call for exposure of patterns with smaller and smaller dimensions, it is becoming necessary to employ techniques which permit enhancement of the current performance of the process of photolithography.

A reduction projection exposure method that features mass-producibility and excellent resolution has been used widely for forming such patterns. According to this method, the resolution varies in proportion to the exposure wavelength and varies in inverse proportion to the numerical aperture (NA) of the projection optical system. The NA is a measure of a lens' capability to collect diffracted light from a mask and project it onto the wafer. The resolution limit R (nm) in a photolithography technique using a reduction exposure method is described by the following equation:

$$R = K1 \times \lambda / (NA)$$

Where: $\lambda$ is the wavelength (nm) of the exposure light
NA is the numerical aperture of the lens
K1 is a constant dependent on a type of resist So far, increases in the resolution limit have been achieved by increasing the numerical aperture (high NA). This method, however, is approaching its limit due to a decrease in the depth of focus and difficulty in the design of lenses and in the lens fabrication technology itself. In recent years, therefore, attention has been given to the approach for shortening the wavelength of the exposure light in order to form finer patterns to support an increase in the integration density of LSIs. For example, a 1-Gbit DRAM requires a 0.2-micrometer pattern while a 4-Gbit DRAM requires a 0.1-micrometer pattern. In order to realize these patterns, exposure light having shorter wavelengths must be used.

Typically, optical photolithography is achieved by projecting or transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Radiation is projected through the optically clear areas onto and through a lens and subsequently onto a substrate.

However, because of increased semiconductor device complexity which results in increased pattern complexity, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore, making diffraction a severe limiting factor for optical photolithography.

A conventional method of dealing with diffraction effects in optical photolithography is achieved by using a phase shift mask, which replaces the previously discussed mask. Generally, with light being thought of as a wave, phase shifting is a change in timing of a shift in wave form of a regular sinusoidal pattern of light waves that propagate through a transparent material.

Typically, phase-shifting is achieved by passing light through areas of a transparent material of either differing thicknesses or through materials with different refractive indexes, or both, thereby changing the phase or the periodic pattern of the light wave. Phase shift masks reduce diffraction effects by combining both diffracted light and phase shifted diffracted light so that constructive and destructive interference takes place favorably. On the average, a minimum width of a pattern resolved by using a phase shifting mask is about half the width of a pattern resolved by using an ordinary mask.

Nonetheless, an inherent problem with a conventional transmission mask, such as the ones described above, is that the substrate undergoes a decrease in transmissivity as the wavelength of light emitted from an exposure light source is decreased to obtain finer patterns. For example, a quartz material substrate becomes more opaque as the wavelength of the light source decreases, particularly when the wavelength is less than 200 nm. This decrease in transmissivity affects the ability to obtain finer resolution patterns. For this reason, a material for a transmission phase shifting mask which can obtain a high transmissivity with respect to light having a short wavelength is needed. It is, however, difficult to find or manufacture such a material having a high transmissivity with respect to short wavelength exposure light.

Under these circumstances, a reflective mask has recently been proposed. In a reflective mask, a recess portion consisting of a reflective phase shifting material is formed on a substrate surface for producing a high resolution pattern while avoiding the problem of a deterioration in quality when the wavelength of light emitted from an exposure light source is decreased. The recess portion is formed by etching, such that the substrate is non-planar, thus allowing the reflective material to fill in the recess areas.

A reflective material formed on a substrate surface has a particular refractive index. As previously stated, a recess or nonplanar portion is formed on the substrate surface consisting of the reflective phase shifting material. A phase difference is obtained by using an optical path difference between the light reflected by the substrate surface and the light reflected by the phase shifting material. Depending on the selection and arrangement of the reflective material and the depth of the recess, different phase shifts may be induced.

In contrast to a transmission mask, not all of the light emitted from an exposure light source goes through a reflective mask because the substrate tends to become opaque as the wavelength of the light source decreases, i.e., less than 200 nm. In fact, most of the light will be blocked by the mask's substrate.

The following problem is posed in a mask of this type. The recess portion is formed by etching. However, it is very difficult to accurately control the etching depth. When the reflection of light is utilized, the amount of change in optical path length is equivalent to twice the amount of change in etching depth. It is, therefore, substantially difficult to realize a controlled phase difference between light reflected by the substrate surface and light reflected by the recess portion.

In summary, reflective masks have been proposed to overcome an inherent problem of transmission phase shifting masks, which is the deterioration in quality at the shorter wavelengths required to form finer line widths. The reduction in transmissivity of the substrate results in a limited achievable resolution of a mask pattern being exposed upon a semiconductor wafer for the formation of integrated circuits and structures. However, a drawback of a reflective mask is the performance of the mask being dependent upon the optical path length; which is effected by both the height of the reflective phase shifting material and the recess depth etched into the substrate. It is difficult to accurately control the etching depth, thus a critical factor is presented.

Hence, there is a need for a reflective mask wherein the optical properties of the mask are independent of the thickness of the reflecting materials, and the optical properties are also independent of the depth of the recess portions formed on a substrate.

SUMMARY OF THE INVENTION

The present invention is a method for fabricating a reflective mask, comprising the steps of fabricating multi-material reflective regions in an alternating, non-overlapping pattern on a planar substrate and planarizing a top surface of the reflective regions such that they are substantially co-planar. When subjected to a desired wavelength of radiation, reflective characteristics of the materials cooperate in a desired manner to form interference patterns which may be focussed on a substrate to expose fine patterns in a resist selected to be sensitive to the particular wavelength of radiation used.

In accordance with another aspect of the invention, a method for fabricating a reflective mask is provided, comprising the steps of coating the planar substrate with a first reflective material having a first set of optical characteristics, selectively removing portions of the first reflective material to expose openings to the transparent substrate, coating the transparent substrate openings and the first reflective material with a second reflective material having a second set of optical characteristics, and planarizing a top surface of the reflective materials such that they are substantially co-planar.

In an alternative embodiment, a method for fabricating a reflective mask is provided, comprising the steps of coating the planar substrate with a first reflective material having a first set of optical characteristics, selectively removing portions of the first reflective material to expose openings to the substrate, coating the substrate openings and the first reflective material with a second reflective material having a second set of optical characteristics, selectively removing portions of the second reflective material to expose openings to the substrate and the first reflective material, coating the openings to the substrate and the first and second reflective materials with a third reflective material having a third set of optical characteristics, and planarizing a top surface of the reflective materials such that they are substantially co-planar.

In a further alternative embodiment, a reflective mask comprises a planar substrate, and a plurality of polished optically reflective regions fabricated on the substrate in an alternating pattern, wherein the top surface of the optically reflective regions are substantially co-planar.

In accordance with another aspect of the invention, a reflective mask, comprising a planar substrate, and a plurality of polished optically reflective regions fabricated on the transparent substrate in an overlapping pattern.

In yet accordance with another aspect of the invention, the optically reflected materials fabricated on the transparent substrate comprise Al, PbSe and PbTe, or combinations thereof to obtain desired phase shifting.

Since the point at which reflection occurs is no longer dependent upon an etching step, but instead is based upon a much more accurate planarization, finer line widths are obtainable using a reflective mask. In addition, higher frequency radiation may be used to define finer geometries with such a reflective mask than with prior transmissive technologies.

DETAILED DESCRIPTION OF THE INVENTION

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined by the appended claims.

In the process of forming a pattern by a reduction projection exposure, it is customary that a member used for reduced-size projection is termed a reticle, and a member for life-size projection is termed a mask; or a member corresponding to an original sheet is termed a reticle, and a member obtained by duplicating such a reticle is termed a mask. In the present invention, any of the masks and reticles classified by such various definitions are referred to as a mask for convenience.

Figure 1A:
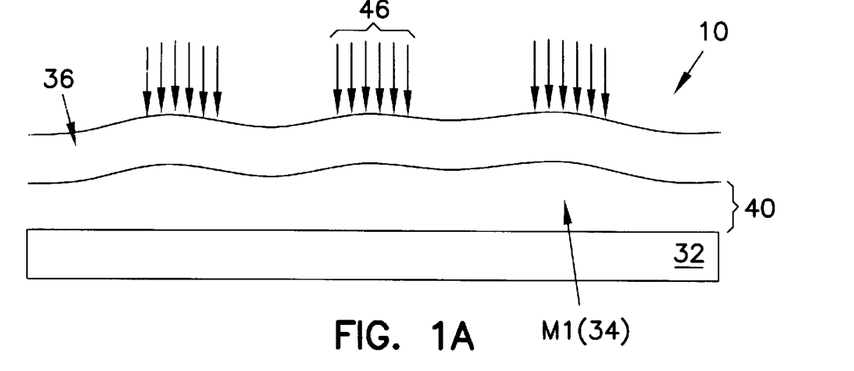
FIGS. 1A–G are structural sectional views showing the steps for fabricating a reflective mask according to the present invention.
Figure 1B:
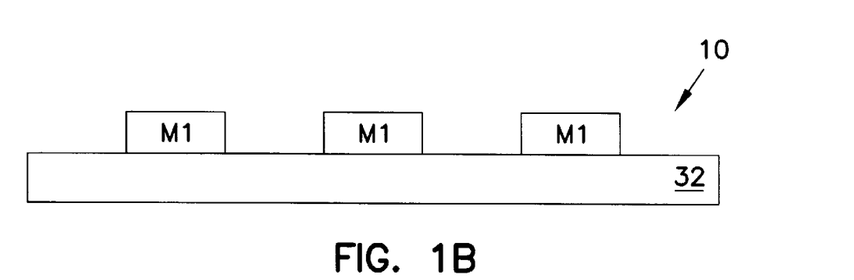

FIGS. 1A–G are structural sectional views showing the steps for fabricating a reflection photomask or mask 10 according to the present invention. With reference to FIG. 1A, the transparent substrate 32 selected for mask 10 must be free of defects on the surfaces, as well as internally. Several types of glasses have been used for making masks, including: soda-lime glass, borosilicate glass, and quartz. However, quartz is the type of glass used in this embodiment for the substrate 32. Other materials compatible with the resist process are acceptable, particularly when compatible with exposure radiation or light source having a wavelength less than 180 nm.

After the substrate 32 has been polished, cleaned and inspected, it is ready to be coated by reflective materials.

Hereinafter, individual reflective materials will also be referred to via the following designations: M1, M2, M3 or M4, some of which may have a low enough reflectivity to be considered opaque. Actual material types and design optical characteristics for M1, M2, M3 and M4 designations will be provided below. These four material designations are not to be considered a closed set, for other material types are acceptable in the fabrication of a reflective mask such as a mask, provided their reflective characteristics are supportive in the design of a desired pattern.

Figure 1C:
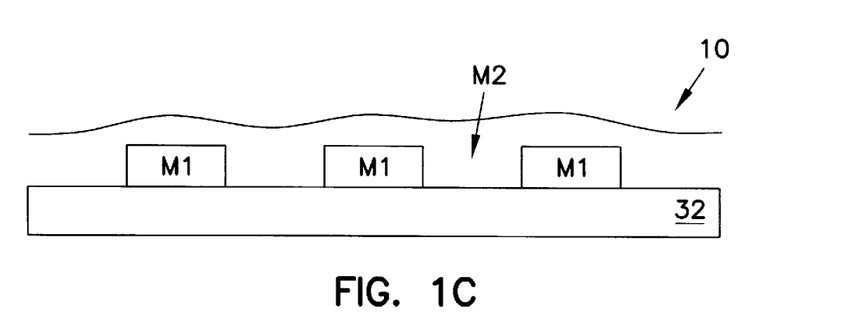
Figure 1D:
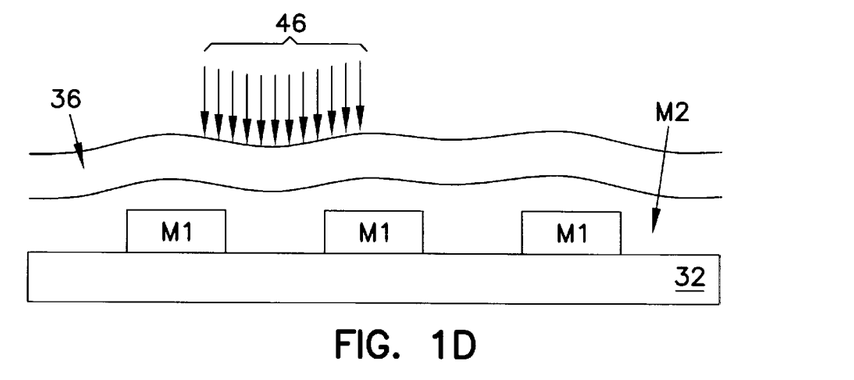
Figure 1E:
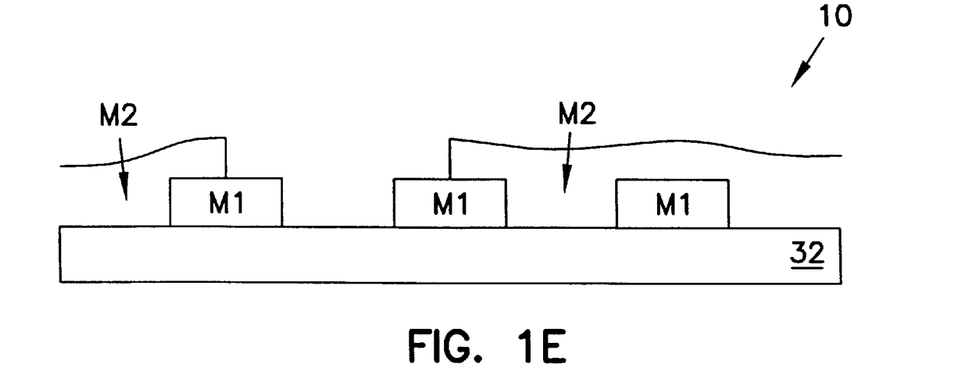
Figure 1F:
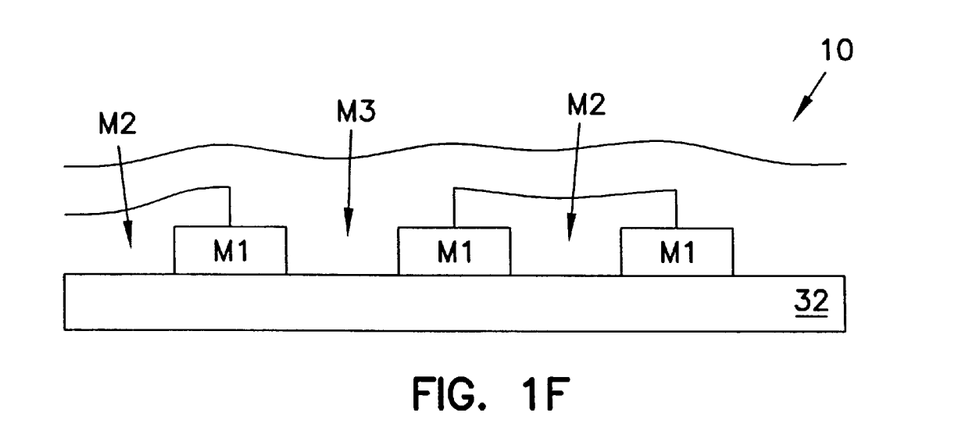
Figure 1G:
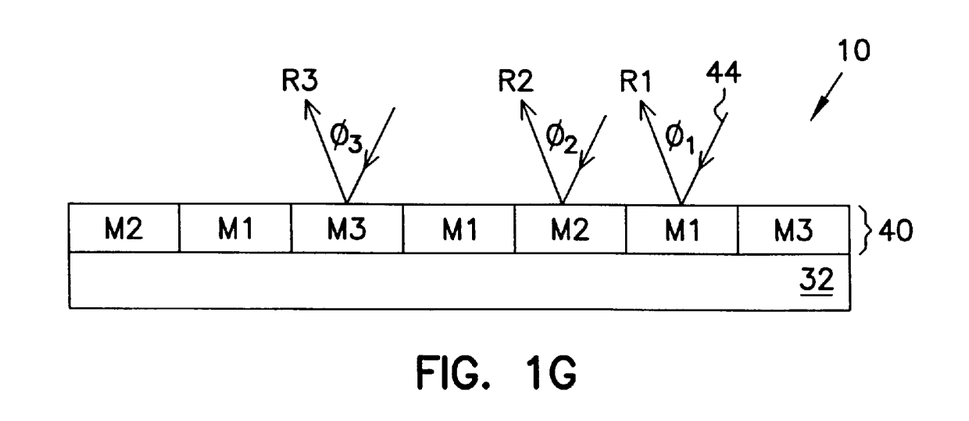

A refractive index N and an absorption coefficient K are two optical characteristics of each of the reflective materials, wherein these characteristics determine the reflectivity R and phase shift $\Phi$ from incident light 44 (reference FIG. 1G). Note, that while the terms "light", "photo" and "optical" are used, they are meant to refer to a broad spectrum of radiation useful for patterning in manufacturing processes using suitably reactive resists. The incident light 44 is reflected by the reflective mask 10 at a certain percentage R and at a certain phase. In other words, R and $\Phi$ are a function of the refractive index N and the absorption coefficient K corresponding to each reflective material type. By selecting materials having particular optical characteristics and configuring them accordingly, desired patterns are formed by the reflective mask 10.

Thus, each reflective material has a defined phase shift $\Phi$ and reflectivity R, such that the optical properties of the mask 10 are independent of the height/thickness 40 of the reflective materials when applied to the substrate 32. It should be noted that the final height 40 of the reflective materials must be large enough to establish and maintain its optical characteristics. This distinctive feature of the invention 10 avoids issues that may arise concerning uniformity of polishing (CMP) or planarization procedures performed during the fabrication process. In contrast to current reflective mask designs, a variance in height of the reflective materials utilized in this invention 10 does not affect the phase shift $\Phi$ resulting from the incident light 44.

Depending on the selection and arrangement of the above identified reflective materials, different phase shifts $\Phi$ may be induced. Light can be reflected and/or absorbed such that certain areas are out of phase with respect to other areas. These various phase levels in effect create different efficiency masks which then may be used to project a high resolution pattern onto a wafer. Furthermore, the reflective materials can be selected so that by attenuating the incident light 44 in selected areas, a zero to one contrast is obtained; the same contrast as you would obtain through a regular chrome on quartz mask.

Referring to FIG. 1A, a reflective material M1 having a first set of optical characteristics is coated onto the substrate 32 and then patterned with a well known resist 36. Methods for coating the substrate 32 are well known in the art such as various deposition processes. The resist 36 is selected based on the material to be patterned as is well known in the art and is also applied in a well known manner. A pattern 46 is defined into material M1 by exposing the resist 36, wherein the resist 36 is used as a mask to etch the material M1. In one embodiment, the resist 36 is a positive tone resist. Afterwards, the resist 36 is stripped, resulting in the M1 reflective regions and openings exposing the substrate 32, as shown in the structural sectional view of FIG. 1B. Other well known patterning methods may also be used to pattern material M1.

As shown in FIG. 1C, the substrate 32 is coated with a second reflective material M2 having a second set of optical characteristics. Resist 36 is then coated on top of material M2, as shown in FIG. 1D. Repeating the steps performed for patterning M1, a pattern 46 is defined into material M2 by exposing the resist 36, wherein the resist 36 is used as a mask to etch the material M2. Again, assume the resist 36 is a positive tone. The resist 36 is then stripped, resulting in the M2 reflective regions along with partially exposing M1 reflective regions, and openings to the substrate 32, as shown in the structural sectional view of FIG. 1E. Again, M2 may be patterned by other methods known to those skilled in the art.

Figure 5A:
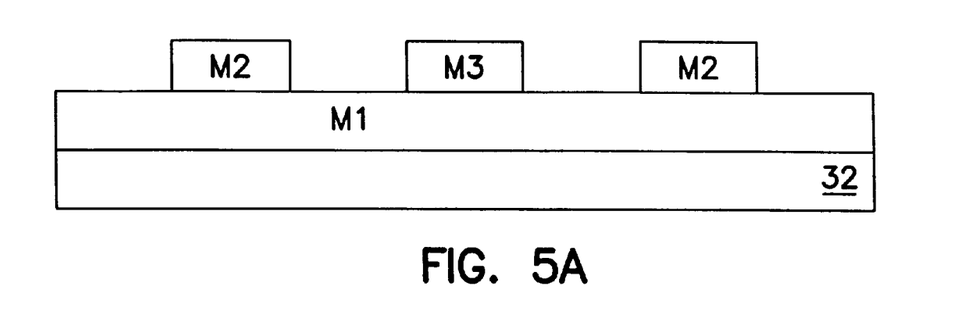
FIGS. 5A–B are diagrams of a layered, overlapping reflective mask according to the present invention.
Figure 5B:
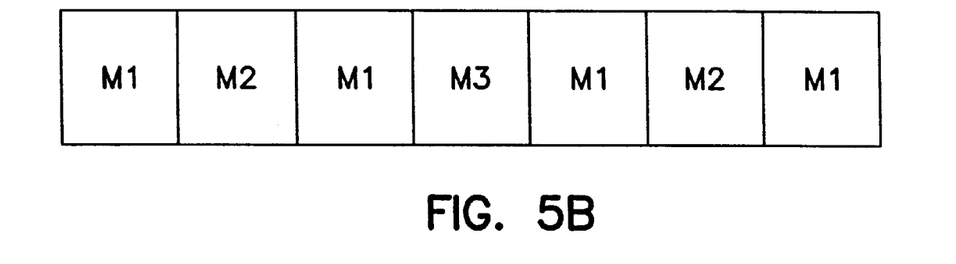

Finally, substrate 32 is coated with reflective material M3 having a third set of optical characteristics. Since the resulting pattern is splitting the M1 and M2 patterns, material M3 does not need to be patterned, but may be, if further reflective materials are desired to be used. The final step in the manufacturing process is to planarize the mask such as by chemical mechanical polishing (CMP) or other well known methods. Polishing a mask is well known in the art. As a result of polishing, material M2 and M3 reflective regions are defined when they are polished to substantially the same height 40 as the material M1 reflective region. It is not essential that the reflective materials all be the same height 40. In fact, the materials could be stacked on top of each other (as shown in FIG. 5), where the height of each material may vary with respect to each other. This aspect of the invention merely facilitates fabrication of the reflective mask 10 without having to perform a controlled etching process on the substrate surface 32 in order to control the reflectivity of the incident light 44.

Ideally, the height 40 is large enough and the materials M1, M2 and M3 are absorbent enough that the performance of the reflective mask 10 is independent of the resulting height 40 of the reflective materials. This avoids any height 40 variations that may arise in the uniformity of the CMP step. Since the thickness 40 slightly varies depending on the coarseness/fineness of the patterns, the performance of the reflective mask 10 as defined using multiple reflective materials will not be affected by these slight variations in height because the reflective materials exhibit their optical characteristics once a sufficient height 40 is provided which in turn allows the optical characteristics of the reflective regions to be established.

In other words, the reflective materials thus provide the desired phase shift $\Phi$ and reflectivity R to define patterns requiring highly resolved line widths to support an increase in the integration density of large scale integrated circuits. Typically, phase-shifting has been utilized, which is traditionally accomplished by passing light through areas of a transparent material (including the substrate assembly) of either varying thicknesses or through materials with different refractive indexes, or both, thereby changing the phase $\Phi$ of the incident light wave 44. In contrast to the performance of a phase shifting mask as just described, a pattern is also formed when the reflective materials described in this invention 10 are utilized. These materials are supportive with light sources having short wavelengths. However, not all of the incident light 44 will pass through the substrate 32. The light that is passed through the mask 10 is reflected such that constructive and destructive interference takes place favorably to form a highly resolved pattern.

The use of the reflective materials overcomes an inherent drawback to a reflective mask wherein the performance of the mask is dependent upon the etched height of the reflective phase shifting materials or in the etched recess formed on a substrate. If a controlled etching process was required to define the optical path lengths of the reflective materials, the resulting dimensions would be very critical, and the slightest deviation in thickness 40 would affect the optical characteristics of a reflective material. This problem is overcome by the present invention.

Furthermore, the reflective mask 10 uses a substrate that is substantially flat or planar, whereas prior art phase shifting masks use a substrate that is contoured and non-planar. Again, this distinctive feature allows the optical characteristics of the mask 10 to be defined by positioning alternating reflective materials 34 on a planar substrate without having to perform a very controlled etching process to precisely form a specific thickness 40 with respect to a reflective material. The reflective materials exhibit their optical characteristics once a sufficient height 40 is provided which in turn allows the optical characteristics of the reflective regions to be established without having to rely on materials that require a controlled etching process to define their optical characteristics.

In reference to FIG. 1G, material M1 has a very low reflectivity and good light absorption characteristics. Materials M2 and M3 have a higher reflectivity and a very high absorption. Reflective materials are selected such that their characteristics, namely the reflectivity R and the phase $\Phi$ of the incident light 44 are substantially independent of the thickness, or height 40 of the reflective materials. This material characteristic of the invention minimizes the importance of uniformity of polishing (CMP) or planarization procedures performed during the fabrication process. In addition, since M1 is used alternately between each of the other materials, it is best to form it first to obtain the best line width control. Note that this allows much leeway in etching the M2 layer in FIG. 1E since the M3 layer will be defined between M1 layers.

As previously stated, the incident light 44 is reflected by the mask 10 at a certain percentage R and at a certain phase $\Phi$. R and $\Phi$ are a function of the refractive index N and the absorption coefficient K of M1, M2, M3 and M4. By selecting a particular combination of these variables, desired patterns may be formed by the Multi layer reflective mask 10 as well as other different type masks.

Acceptable reflective materials comprise Aluminum, PbSe, and PbTe. Aluminum, at a thickness of approximately 150 nm has a refractive index N of 0.067, absorption coefficient K of 1.59, phase $\Phi$ of −116 degrees and an 86% reflectivity R. PbSe has the following characteristics at a thickness of approximately 150 nm: N=0.715, K=0.62, $\Phi$=85 degrees, R=14%. PbTe has the following characteristics at a thickness of approximately 150 nm: N=0.73, K=0.82, $\Phi$=−83 degrees, R=20%. Other materials may also be used as will be apparent to those skilled in the art. In addition, combinations of materials may also be used to vary the phase shift provided by the material. For instance, PbSe could be used as an attenuated material in conjunction with Aluminum as a reflective material. Their combination provides a phase difference of approximately 201 degrees. PbSe and PbTe can also be used in conjunction to build chromeless or alternating phase masks. Their reflectivity is similar and their phase difference is approximately 168 degrees.

Figure 2:
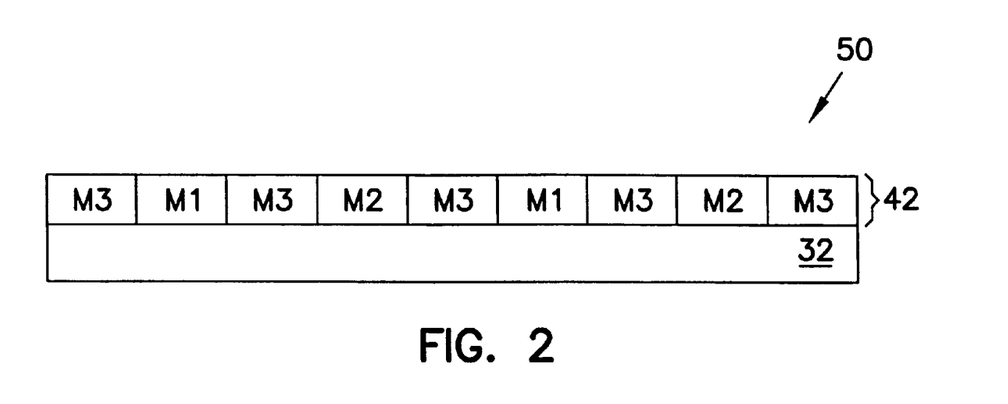
FIG. 2 is a diagram of an alternating phase shifting mask according to the present invention.
Figure 3:
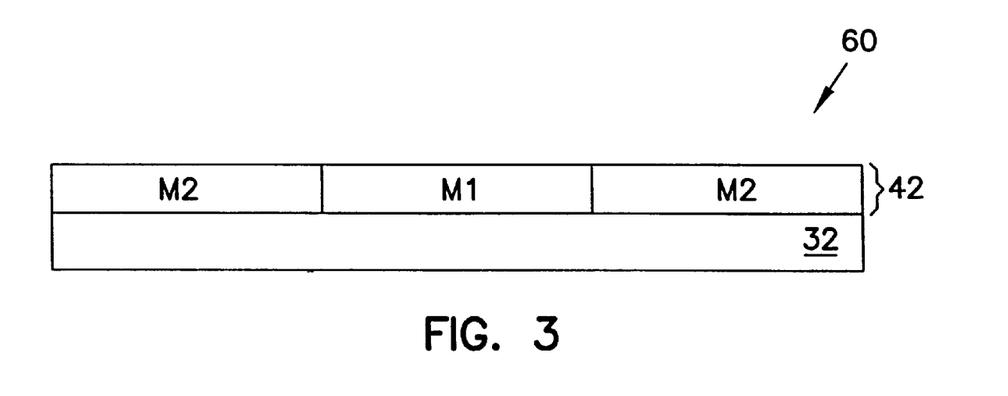
FIG. 3 is a diagram of a chromeless phase shifting mask according to the present invention.
Figure 4:
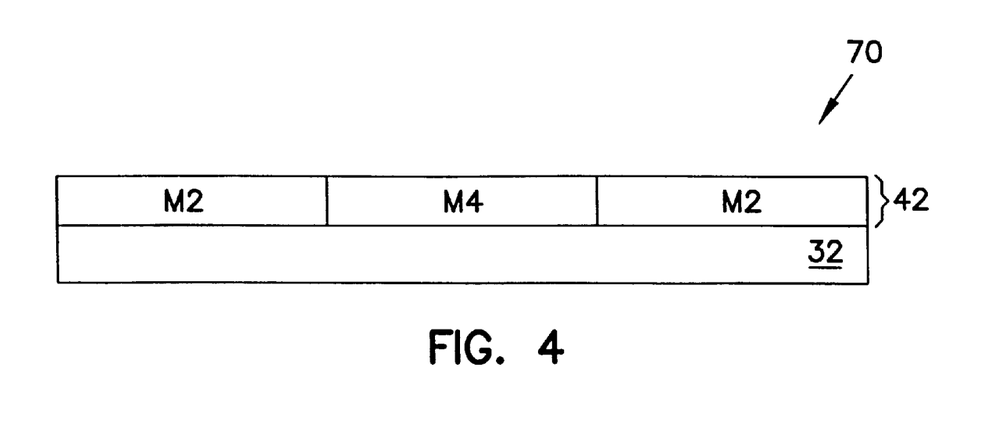
FIG. 4 is a diagram of an attenuated phase shifting mask according to the present invention.

Examples of some of the various types of masks that are supported by the reflective materials are shown in FIGS. 2–4. Note that each number suffix of reflectivities R and phases $\Phi$ correspond to the reflective materials suffix. In FIG. 2, a diagram of an alternating phase shifting mask 50 using the reflective materials M1, M2 and M3 according to the present invention is illustrated. To build an alternating aperture 50, materials M1, M2 and M3 require the following optical characteristics:

$$R1=R2$$

$$\Phi1-\Phi2=180°$$

$$R3\sim0$$

As indicated, one of the materials, in this case material M3, has a reflectivity close to zero, such as $LiNbO_3$, Potassium or other known materials. The other two materials, M1 and M2, are reflective, but are out of phase from each other. The reflectivity of R1=R2 means that materials are reflecting the same amount of light, but the phases of the light reflected are different. These variables provide the function of an alternating aperture phase shifting mask 50. Mask 50 functions very similar to that of a transparent alternating aperture phase shifting mask. The critical difference in aperture 50 is that the height 42 is not a factor because the characteristics of materials M1, M2 and M3 are such that this factor becomes irrelevant in the performance of the mask 50. Material M3 could be omitted if the substrate 32 is very transparent.

FIG. 3 is a diagram of a chromeless phase shifting mask 60 using reflective materials according to the present invention. To build a chromeless phase shifting mask 60, only materials M1 and M2 are needed, such that:

$$R1=R2$$

$$\Phi1-\Phi2=180°$$

In this embodiment of the invention, basically, an alternating aperture is obtained, but material M3 is omitted. Materials M1 and M2 have the same reflectivity, but the reflected radiation from M1 is 180 degrees out of phase with respect to that reflected from M2. The result is the light reflected by material M1 and the light reflected by material M2 is such that at the boundary between materials M1 and M2, a null forms due to the canceling out of the light where it is now out of phase. This null prints as a very small resist line, if it is a positive tone, on the wafer or a very small space if it is a negative tone, on the wafer.

FIG. 4 is a diagram of an attenuated phase shifting mask 70 using reflective materials. To build an attenuating phase shifting mask 70, two layers are needed such that:

$$5\% < R4/R2 < 15\%$$

$$\Phi4-\Phi2=180$$

Basically, this embodiment of the invention provides the same function as a regular mask, i.e., a regular chrome mask operating in a transmission mode. However, the inventive aspect of this invention 10 is the optical characteristics of the mask 10 can be obtained without having to perform a controlled etching process on the substrate 32 in order to define an optical path length. For a regular mask, only one material reflects the radiation.

With this particular type of mask 10 using the reflective materials, material M4 reflects only a certain portion of the radiation, a typical number is 5% to 15% of the light reflected by material M2. Material M2 reflects as much light as possible. The light reflected by M4 will be out of phase with respect to the light reflected by M2. A benefit of an attenuated phase shifting mask 70 is an enhancement in the sense that the light reflected by M2 is canceled out by the light reflected by M4 because it is out of phase, thus causing an edge effect to be obtained in the pattern. This, in effect, improves the quality of the edges of a pattern.

FIGS. 5A–B are a diagram of a layered reflective mask according to the present invention. The reflective materials are still alternately patterned as illustrated in the prior Figures, but they are overlapping, as shown in FIG. 5A (front view of a reflective mask), and as shown in FIG. 5B (top view of the same).

In the above described invention, a reflective mask and a method of fabricating the same, overcomes an inherent problem of transmission phase shifting masks, which is the deterioration in resolution quality as the wavelength of the radiating light source decreases. Furthermore, the reflective mask provides the advantage of not having the performance of the mask being dependent upon the thickness of the reflective materials, which would normally be subject to a controlled etching process or subject to controlled chemical mechanical polishing (CMP) procedures performed during the fabrication process. Instead, a basic planarization procedure can define reflective regions such that the phase and reflectivity of the mask are determined by the optical characteristics of the reflecting materials themselves when they are substantially planar to each other.

It is to be understood, however, that even though numerous characteristics of the present invention have been set forth in the foregoing description, together with details of the method, structure and function of the invention, the disclosure is illustrative. Changes in matters of order, shape, size, and arrangement of the parts, and various properties of the operation may be made within the principles of the invention. For instance, to provide a region of low reflectivity, a transmissive or opaque substrate may be used as opposed to being coated with an opaque material. This would provide the same function as an opaque material, but would potentially eliminate some process steps in forming the mask. In FIG. 2, material M3, which has very low reflectivity could be omitted, with the substrate providing its function. Thus, only layers M1 and M2 need be formed. Further embodiments will be apparent to one skilled in the art.

What is claimed is:

1. A method for fabricating a reflective lithographic mask for use in forming semiconductor devices, consisting essentially of the steps of:
    fabricating multi-material reflective regions in an alternating pattern on a substrate; and
    planarizing the reflective regions such that they are substantially co-planar.

2. The method for fabricating the reflective mask of claim 1, wherein the reflective regions are selected from the group of materials consisting of Al, PbSe, PbTe and combinations thereof.

3. A method for fabricating a reflective mask, comprising the steps of:
    coating a substrate with a first reflective material having a first set of optical characteristics;
    selectively removing portions of the first reflective material to expose openings to the substrate;
    coating the substrate openings and the first reflective material with a second reflective material having a second set of optical characteristics; and
    planarizing the reflective materials such that they are substantially co-planar.

4. The method for fabricating the reflective mask of claim 3, wherein the step of selectively removing portions of the first reflective material further comprises the step of patterning a resist film on the first reflective material.

5. The method for fabricating the reflective mask of claim 3, wherein the first and second reflective materials have a substantially equal reflectivity and a phase difference of approximately 180 degrees.

6. The method for fabricating the reflective mask of claim 3, wherein the first reflective material has a reflectivity which is approximately between 5 and 15% of the reflectivity of the second material and wherein they have a phase difference of approximately 180 degrees.

7. A method for fabricating a reflective mask, comprising the steps of:
    coating a planar substrate with a first reflective material having a first set of optical characteristics;
    selectively removing portions of the first reflective material to expose openings to the substrate;
    coating the substrate openings and the first reflective material with a second reflective material having a second set of optical characteristics;
    selectively removing portions of the second reflective material to expose openings to the substrate and the first reflective material;
    coating the openings to the transparent substrate and the first and second reflective materials with a third reflective material having a third set of optical characteristics; and
    planarizing a top surface of the reflective materials such that they are substantially co-planar.

8. The method for fabricating the reflective mask of claim 7, wherein the step of selectively removing portions of the first reflective material further comprises the step of patterning a resist film on the first reflective material.

9. The method for fabricating the reflective mask of claim 7, wherein the step of selectively removing portions of the second reflective material further comprises the step of patterning a resist film on the second reflective material.

10. The method for fabricating the reflective mask of claim 7, wherein the first and second reflective materials have reflectivities which are substantially equal, and wherein the third reflective material has a reflectivity which is approximately zero.

11. The method for fabricating the reflective mask of claim 10, wherein the first and second reflective materials have a phase difference of approximately 180 degrees.

12. A reflective mask, consisting essentially of:
    a planar substrate; and
    a plurality of polished optically reflective regions fabricated on the substrate in an alternating, non-overlapping pattern, wherein the top surface of the optically reflective regions are substantially co-planar.

13. The reflective mask of claim 12, wherein the reflected regions are selected from the group of materials consisting of Al, PbSe, PbTe and combinations thereof.

14. The reflective mask of claim 12, wherein the mask is a phase-shift type mask.

15. A reflective mask, comprising:
    a transparent, planar substrate; and
    a plurality of polished optically reflective regions fabricated on the transparent substrate in an overlapping pattern.

16. The reflective mask of claim 15 wherein the reflective regions are selected from the group of materials consisting of Al, PbSe, PbTe and combinations thereof.

17. A reflective lithographic mask for use in forming semiconductor devices, the mask comprising:
    a substrate;
    a plurality of first reflective material regions formed on the substrate and having a first set of optical characteristics;
    a plurality of second reflective material regions formed on the substrate between the first reflective material regions and having a second set of optical characteristics; and wherein each of the plurality of first and second material regions cooperate to form desired patterns when radiation reflected from them is focussed on a semiconductor substrate.

18. The reflective lithographic mask of claim 17 wherein the plurality of first and second reflective material regions are planarized such that they have top surfaces which are substantially co-planar.

19. The reflective lithographic mask of claim 17, wherein the plurality of first and second reflective materials regions have a substantially equal reflectivity and a phase difference of approximately 180 degrees.

20. The reflective lithographic mask of claim 17, wherein the plurality of first reflective material regions have a reflectivity which is approximately between 5 and 15% of the reflectivity of the plurality of second material regions and wherein they have a phase difference of approximately 180 degrees.

21. A reflective lithographic mask for use in forming semiconductor devices, the mask comprising:

a substrate;

a plurality of first reflective material regions formed on the substrate and having a first set of optical characteristics;

a plurality of second reflective material regions formed on the substrate between the first reflective material regions and having a second set of optical characteristics;

a plurality of third reflective material regions formed on the substrate between the first and second reflective material regions and having a third set of optical characteristics; and wherein each of the plurality of first, second and third material regions cooperate to form desired patterns when radiation reflected from them is focussed on a semiconductor substrate.

22. The reflective lithographic mask of claim 21, wherein the first and second reflective materials have reflectivities which are substantially equal, and wherein the third reflective material has a reflectivity which is approximately zero.

23. The reflective lithographic mask of claim 22, wherein the first and second reflective materials have a phase difference of approximately 180 degrees.

* * * * *